United States Patent
Yang et al.

(10) Patent No.: US 9,728,600 B2
(45) Date of Patent: Aug. 8, 2017

(54) PARTIALLY BIASED ISOLATION IN SEMICONDUCTOR DEVICES

(71) Applicant: Freescale Semiconductor, Inc., Austin, TX (US)

(72) Inventors: Hongning Yang, Chandler, AZ (US); Daniel J. Blomberg, Chandler, AZ (US); Xu Cheng, Chandler, AZ (US); Xin Lin, Phoenix, AZ (US); Zhihong Zhang, Chandler, AZ (US); Jiang-Kai Zuo, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/851,355

(22) Filed: Sep. 11, 2015

(65) Prior Publication Data

US 2017/0077219 A1    Mar. 16, 2017

(51) Int. Cl.
| | |
|---|---|
| *H01L 29/06* | (2006.01) |
| *H01L 29/78* | (2006.01) |
| *H01L 29/10* | (2006.01) |
| *H01L 29/66* | (2006.01) |
| *H01L 21/22* | (2006.01) |
| *H01L 21/768* | (2006.01) |
| *H01L 29/36* | (2006.01) |

(Continued)

(52) U.S. Cl.
CPC ......... *H01L 29/0634* (2013.01); *H01L 21/22* (2013.01); *H01L 21/76897* (2013.01); *H01L 23/528* (2013.01); *H01L 27/0251* (2013.01); *H01L 29/1095* (2013.01); *H01L 29/365* (2013.01); *H01L 29/66689* (2013.01); *H01L 29/7823* (2013.01)

(58) Field of Classification Search
CPC ............... H01L 29/0634; H01L 23/528; H01L 27/0251; H01L 29/1095; H01L 29/365; H01L 29/66689; H01L 29/7823
USPC ........................................................ 257/339
See application file for complete search history.

(56) References Cited

U.S. PATENT DOCUMENTS

| | | | | |
|---|---|---|---|---|
| 3,766,449 A | * | 10/1973 | Bruchez | H01L 29/0813 257/541 |
| 3,818,463 A | * | 6/1974 | Grundy | G11C 11/404 257/532 |

(Continued)

OTHER PUBLICATIONS

Non-Final Office Action in co-pending U.S. Appl. No. 14-851,360, dated Nov. 10, 2016, 12 pages.

*Primary Examiner* — Earl Taylor (57) ABSTRACT

A device includes a semiconductor substrate, a doped isolation barrier disposed in the semiconductor substrate and defining a core device area within the doped isolation barrier, an isolation contact region disposed in the semiconductor substrate outside of the core device area, and a body region disposed in the semiconductor substrate within the core device area, and in which a channel is formed during operation. The body region is electrically tied to the isolation contact region. The body region and the doped isolation barrier have a common conductivity type. The body region is electrically isolated from the doped isolation barrier within the core device area. The doped isolation barrier and the isolation contact region are not electrically tied to one another such that the doped isolation barrier is biased at a different voltage level than the isolation contact region.

19 Claims, 4 Drawing Sheets

(51) Int. Cl.
*H01L 27/02* (2006.01)
*H01L 23/528* (2006.01)

(56) References Cited

U.S. PATENT DOCUMENTS

| | | | | |
|---|---|---|---|---|
| 3,827,034 | A * | 7/1974 | Colaco | G11C 11/403 257/273 |
| 4,069,494 | A * | 1/1978 | Grundy | H01L 27/0623 257/273 |
| 4,145,621 | A * | 3/1979 | Colaco | H01L 21/761 257/536 |
| 5,175,117 | A * | 12/1992 | Garling | H01L 21/761 257/E21.544 |
| 6,882,023 | B2 * | 4/2005 | Khemka | H01L 29/0634 257/328 |
| 8,541,862 | B2 * | 9/2013 | Yang | H01L 21/761 257/492 |
| 8,652,930 | B2 * | 2/2014 | Yang | H01L 21/761 257/E21.544 |
| 9,024,380 | B2 * | 5/2015 | Chen | H01L 29/66659 257/337 |
| 9,054,027 | B2 * | 6/2015 | Pendharkar | H01L 29/2003 |
| 9,054,149 | B2 * | 6/2015 | Lin | H01L 29/73 |
| 9,159,803 | B2 * | 10/2015 | Min | H01L 29/66659 |
| 9,214,542 | B2 * | 12/2015 | Chen | H01L 29/66659 |
| 9,236,472 | B2 * | 1/2016 | Chen | H01L 29/7835 |
| 9,306,060 | B1 | 4/2016 | Yang et al. | |
| 2013/0134511 | A1 * | 5/2013 | Yang | H01L 21/761 257/339 |
| 2013/0270606 | A1 * | 10/2013 | Chen | H01L 29/7835 257/183 |
| 2013/0270635 | A1 * | 10/2013 | Parris | H01L 29/66659 257/336 |
| 2013/0341717 | A1 * | 12/2013 | Chen | H01L 29/66659 257/337 |
| 2013/0344672 | A1 * | 12/2013 | Yang | H01L 21/761 438/294 |
| 2014/0054694 | A1 * | 2/2014 | Min | H01L 29/66659 257/336 |
| 2014/0061858 | A1 * | 3/2014 | Lin | H01L 29/73 257/565 |
| 2014/0203358 | A1 * | 7/2014 | Yang | H01L 29/73 257/335 |
| 2014/0252470 | A1 * | 9/2014 | Chen | H01L 29/66659 257/337 |
| 2014/0252472 | A1 * | 9/2014 | Chen | H01L 29/7816 257/339 |
| 2014/0327011 | A1 * | 11/2014 | Pendharkar | H01L 29/2003 257/76 |
| 2015/0236087 | A1 | 8/2015 | Chang et al. | |
| 2015/0270333 | A1 | 9/2015 | Yang et al. | |
| 2015/0270357 | A1 * | 9/2015 | Pendharkar | H01L 29/2003 257/76 |
| 2016/0043217 | A1 | 2/2016 | Cai | |
| 2016/0099240 | A1 * | 4/2016 | Chen | H01L 29/66659 438/236 |
| 2016/0118495 | A1 * | 4/2016 | Chen | H01L 29/7835 257/343 |
| 2016/0181421 | A1 | 6/2016 | Yang et al. | |

* cited by examiner

PARTIALLY BIASED ISOLATION IN SEMICONDUCTOR DEVICES

FIELD OF INVENTION

The present embodiments relate to semiconductor devices.

BACKGROUND

Integrated circuits (ICs) and other electronic devices often include arrangements of interconnected field effect transistors (FETs), also called metal-oxide-semiconductor (MOS) field effect transistors (MOSFETs), or simply MOS transistors or devices. A typical MOS transistor includes a gate electrode as a control electrode and spaced apart source and drain electrodes. A control voltage applied to the gate electrode controls the flow of current through a controllable conductive channel between the source and drain electrodes.

Power transistor devices are designed to be tolerant of the high currents and voltages that are present in power applications such as motion control, air bag deployment, and automotive fuel injector drivers. One type of power MOS transistor is a laterally diffused metal-oxide-semiconductor (LDMOS) transistor. In an LDMOS device, a drift space is provided between the channel region and the drain region.

LDMOS devices may be designed to operate in a high-side configuration in which all of the device terminals are level shifted with respect to the substrate potential. Devices configured for high-side operation have been applied in power switchers in DC-to-DC converters, which have respective LDMOS devices for the high side and low side. High-side capable devices are designed to prevent a direct forward bias or punch-through path from a body region of the LDMOS device to an underlying substrate.

LDMOS devices are often used in applications, such as automotive applications, involving operational voltages greater than 40 volts. Breakdown resulting from applying such high voltages to the drain is often prevented through a reduced surface field (RESURF) structure in the LDMOS device design. The RESURF structure is designed to deplete the drift space of the LDMOS device in both vertical and lateral directions, thereby reducing the electric field near the surface at the drift region and thus raising the off-state breakdown voltage (BVdss) of the device.

Some LDMOS devices have a "double RESURF" structure. For example, in n-channel LDMOS devices, the drift space contains an upper level n-type region and a lower level p-type region, with an n-type buried isolation layer beneath the p-type region. The double nature of the structure refers to the depletion of the two regions and the reduction of the electric field in the related junction areas. Double RESURF structures typically apply the drain voltage to isolation regions in order to deplete the both the n-type and p-type regions.

However, biasing the isolation regions at the drain voltage increases the field stress between the body of the LDMOS device and a buried isolation layer. Breakdown may instead occur between the body and the buried isolation layer, thereby limiting the breakdown voltage. Previous efforts to address such source/body-based breakdown have introduced fabrication challenges or degraded the electrostatic discharge (ESD) and safe operating area (SOA) performance of the device.

BRIEF DESCRIPTION OF THE DRAWINGS

The components and the figures are not necessarily to scale, emphasis instead being placed upon illustrating the principles of the various embodiments. Moreover, in the figures, like reference numerals designate corresponding parts throughout the different views.

DETAILED DESCRIPTION OF THE PRESENTLY PREFERRED EMBODIMENTS

Embodiments of laterally diffused metal oxide semiconductor (LDMOS) and other power transistor devices and electronic apparatus with partially biased isolation and/or core-isolated body regions are described. Isolation regions may be partially lifted to a bias voltage level using a well region that couples the isolation regions to an isolation contact region. The well region is positioned and otherwise configured to be depleted of charge carriers. As a result, some of the bias voltage applied to the isolation contact region is sustained across the depleted well region. Only a portion of the bias voltage is therefore passed on to the isolation regions. The depleted well region thus provides partial biasing, or lifting of the isolation potential.

The partial lifting of the isolation potential avoids biasing the isolation regions at voltage levels that would otherwise establish the breakdown voltage level of the device. With significantly less voltage stress between the device body and the isolation regions, breakdown voltage levels (e.g., BVDSS levels) up to, for instance, 100 Volts or beyond may be achieved.

The depleted well region is incorporated into a periphery of the device, rather than in the core device area. The peripheral location may be useful because, for large power devices, the size of the peripheral areas of the devices is relatively negligible. As a result, the overall increase in device size is negligible. Performance parameters related to device size, such as resistance, are thus not significantly affected.

Another depleted well region may be used to partially bias isolation regions adjacent a deep trench isolation (DTI) region. Additional breakdown protection for the DTI region may thus be provided. In some cases, the depleted well regions are disposed in a laterally symmetrical arrangement about the isolation contact region, in which case the same amount of bias voltage is sustained. In other cases, the depleted well region protecting the DTI region may be larger (e.g., wider) such that even less voltage stress is placed on the DTI region.

The depleted well region may be formed in both n-channel and p-channel devices. The method embodiments may form the depleted well region using an implant directed to forming a drift region (e.g., n-channel devices with a p-type substrate) or a body region (e.g., p-channel devices with a p-type substrate). Other regions may also be formed using available implants. For instance, a buried well region used to deplete the depleted well region may be configured to form a RESURF region used to deplete a drift region of an n-channel LDMOS device. Increases in fabrication costs may thus be avoided.

In some embodiments, one or more aspects of the device in the core device area are configured to support the partial biasing of the isolation regions. For instance, in devices in which the device body and the isolation regions have the same conductivity type (e.g., p-channel devices with a p-type substrate), the device body may be electrically isolated from the isolation regions within the core device area. The device body may be surrounded by a number of oppositely doped, buried wells. One or more of the buried wells may be formed using an implant directed to forming other device regions, such as the implant that forms the buried well regions used to deplete both the depleted well region for partial isolation biasing and the drift region of, e.g., an n-channel LDMOS device with a p-type substrate.

Figure 1:
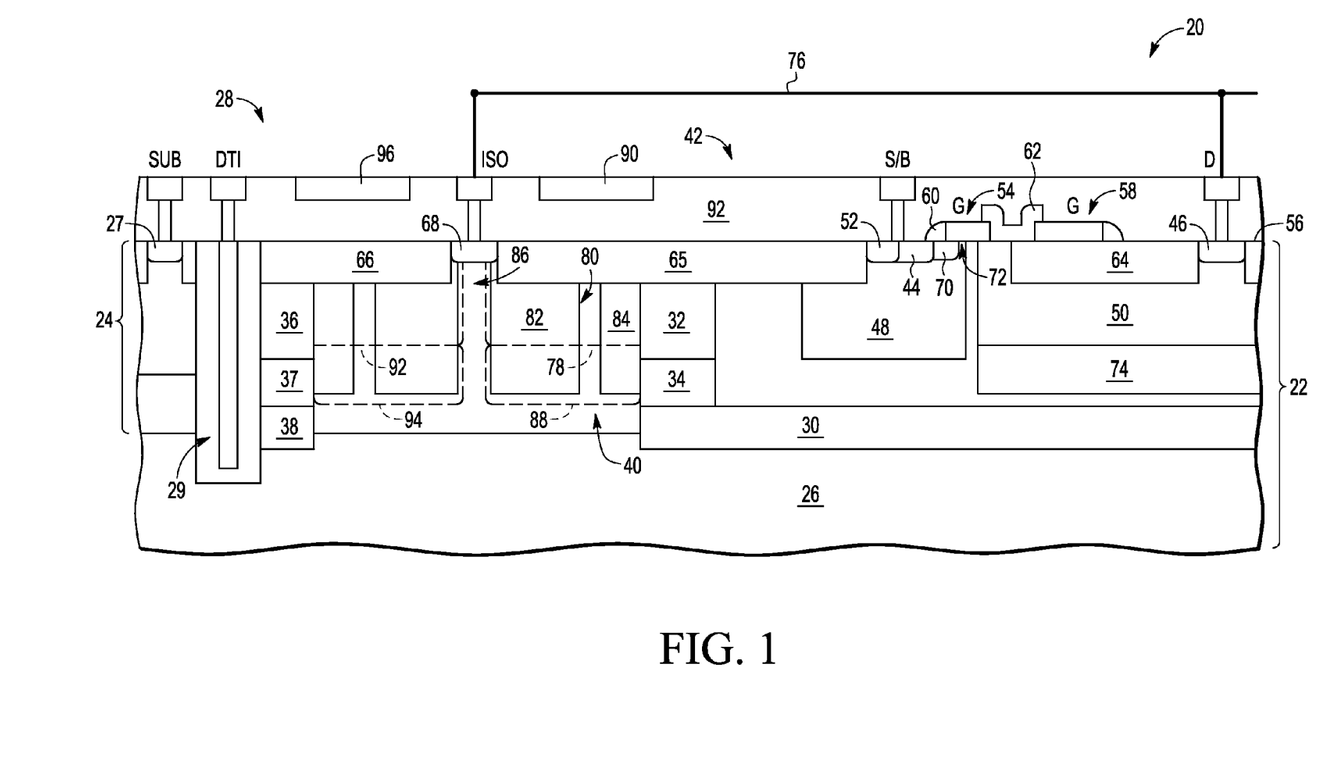
FIG. 1 is a cross-sectional, schematic, partial view of an exemplary n-channel LDMOS (or NLDMOS) transistor with partially biased isolation in accordance with one embodiment.

FIG. 1 is a schematic cross-sectional view of an example of an LDMOS device 20 constructed in accordance with one embodiment. In this embodiment, the device 20 is configured as an n-channel device. The device 20 may be configured as a RESURF transistor. In this example, the device 20 has a double RESURF arrangement.

The device 20 includes a semiconductor substrate 22, which may, in turn, include a number of epitaxial layers 24. In this example, the semiconductor substrate 22 includes a single p-type epitaxial layer 24 grown on an original, bulk substrate 26. The original substrate 26 may be a heavily doped p-type substrate in some cases, such as those having multiple epitaxial layers. The substrate 22 may be biased via a substrate contact region 27. The device 20 may alternatively or additionally include non-epitaxial layers in which one or more device regions are formed.

Any one or more of the layers of the semiconductor substrate 22 may include silicon. Alternative or additional semiconductor materials may be used in other embodiments. The structural, material, and other characteristics of the semiconductor substrate 22 may vary from the example shown. Although useful for increasing the breakdown voltage in connection with bulk substrates, the disclosed embodiments are not limited to bulk substrates. For example, the semiconductor substrate 22 may be or include a silicon-on-insulator (SOI) substrate. Additional, fewer, or alternative layers may be included in the semiconductor substrate 22. For example, any number of additional semiconductor and/or non-semiconductor layers may be included. The disclosed devices are thus not limited to, for instance, bulk silicon substrates or substrates including epitaxially grown layers, and instead may be supported by a wide variety of other types of semiconductor substrates.

A device area 28 of the device 20 is depicted in FIG. 1. In this case, only one side or half of the device area 28 is shown. For example, the device area 28 may be laterally symmetrical about, e.g., a drain region, and, thus include a portion that mirrors the portion shown. The device area 28 may be defined by one or more doped device isolating layers or other regions in the semiconductor substrate 22 (e.g., the epitaxial layer 24). The regions may be doped semiconductor regions and/or undoped (e.g., dielectric) regions. In this example, the device area 28 is defined by a deep-trench isolation (DTI) ring 29. The structures in the device area 28 are laterally isolated from a remainder of the substrate 22 by the deep-trench isolation (DTI) ring 29.

A doped isolation barrier is provided for further device isolation. The doped isolation barrier may be disposed along the periphery of the device area 28. The doped isolation barrier may include a number of doped isolation layers and regions provided within the DTI ring 29 along the periphery of the device area 28. The layers and regions of the doped isolation barrier may laterally and/or otherwise surround the remainder of the device area 28 for further isolation of the device 20. For instance, the regions or layers of the doped isolation barrier may form an isolation tub in which the active components of the device 20 are disposed. The isolation tub includes a bottom and sidewalls extending upward from the bottom. In this example, the doped isolation barrier includes a buried isolation layer 30 that defines a bottom of the isolation tub. The doped isolation barrier also includes isolation wells 32, 34 that define sidewalls of the isolation tub. The isolation wells 32, 34 are stacked upon one another. The isolation well 34 is in contact with the buried isolation layer 30 to electrically connect the doped isolation barrier for the device 20. In other cases, a single well, or additional wells, may be used to define the sidewalls. In this example, with a p-type substrate, the regions and layers of the doped isolation barrier are n-type regions.

One or more of the doped isolation layers and regions may be replicated along the DTI ring 29 to provide further isolation. In the example of FIG. 1, regions 36-38 are formed along the DTI ring 29. The regions 36, 37 may be formed with, and configured similarly to, the isolation wells 32, 34, and the region 38 may be formed with, and configured similarly to, the buried isolation layer 30. In some cases, the buried isolation layer 30 has a gap 40 that defines the region 38.

The doped isolation barrier defines a core device area 42 of the device 20. The core device area 42 may correspond with the area in which the active components of the device 20 are disposed. The buried isolation layer 30 extends across the entire lateral extent of the core device area 42. The lateral extent of the core device area 42 is defined in this example by the isolation wells 32, 34. The isolation wells 32, 34 may thus be ring-shaped to laterally surround the core device area 42.

The buried isolation layer 30 may be formed in the semiconductor substrate 22 before the growth of the epitaxial layer 24 thereof. The buried n-type layer may thus extend laterally across and under the regions disposed, and later formed, in the core device area 42. The buried isolation layer 30 may alternatively or additionally assist in depletion of a drift region of the device 20 to support the RESURF effect, as described below.

One or more of the layers and regions of the doped isolation barrier may have a dopant concentration level and/or be otherwise configured for high voltage (HV) operation (e.g., high side operation in which the terminals of the device 20 are level shifted relative to the semiconductor substrate 22, which may be grounded). For example, the higher dopant concentration level of the isolation barrier layer may be useful in preventing punch-through. Any number of the device isolation wells, sinks, or buried layers may or may not be connected to one another. Additional, fewer, or alternative device isolation layers or regions may be provided in the semiconductor substrate 22.

Within the core device area 42, the device 20 includes a source region 44, a drain region 46, a body region 48 in which the source region 44 is disposed, and a drift region 50 in which the drain region 46 is disposed. In this example, the body region 48 is a p-type well formed in the epitaxial layer 24 of the substrate 22. The body region 30 may be biased via one or more heavily doped p-type body contact regions or electrodes 52 formed in or otherwise above the p-type well of the body region 48 in the semiconductor substrate 22. The dopant concentration of each contact region 52 may be at a level sufficient to establish an ohmic contact to the body region 48.

The source and drain regions 44 and 46 are laterally spaced from one another in the lateral dimension shown in the cross-section of FIG. 1. Any number of source or drain regions 44, 46 may be provided. The drain region 46 need not be centered or otherwise disposed between, or laterally surrounded by, the source region 44 as shown. In this example, the source and drain regions 44 and 46 are heavily doped n-type doped portions of the epitaxial layer 24. The heavily doped n-type source region 44 is disposed within, on, and/or otherwise above the body region 30. The heavily n-type doped drain region 46 is spaced from the body region 48 along the lateral dimension shown in FIG. 1. Such spacing defines a conduction path of the device between the source and drain regions 44 and 46. The regions 44, 46, or a portion thereof, may have a dopant concentration at a level sufficient to establish ohmic contacts for biasing the drain region 46 and the source region 44. In this n-channel LDMOS configuration, the drain region 46 is biased at a relatively high drain-source voltage, Vds, relative to the source region 44.

The device 20 includes one or more gate structures 54 formed on or above a surface 56 of the semiconductor substrate 22. In this example, the device 20 includes a field plate structure 58 over the drift region 50 for depletion thereof. The gate structure 54 is disposed between the source region 44 and the drain region 46. The gate structure 54 and the field plate structure 58 may be electrically connected to one another. In some embodiments, the gate structure 54 surrounds the drain region 46, which may be centrally or internally disposed within the device area 28. Alternatively, the gate structure 54 may be arranged in a dual gate finger configuration in which two transistors are symmetrically arranged to share the same drain region 46. The gate structure 54 includes a polysilicon or other conductive plate located on or above a gate dielectric. For example, the gate dielectric may include silicon dioxide (or oxide) deposited or otherwise formed on the surface 56. The gate structure 54 may include one or more dielectric sidewall spacers 60 disposed along lateral edges of the gate structure 54. The sidewall spacers 60 may cover the lateral edges to act as a silicide blocker to prevent a silicide short along the surface of the substrate 22. In the example of FIG. 1, a dielectric structure 62 is disposed between the gate structure 54 and the field plate 58. The sidewall spacers 60 may provide spacing to separate the conductive components of the gate structure 54 from the source region 44 and other regions of the device region 28. In this example, one of the sidewall spacers 60 is used for alignment purposes in defining an edge of the source region 44.

The configuration of the gate structure 54 may vary. The configuration of the gate structure 54 may include multiple conductive layers (e.g., polysilicon plates). The components, materials, and other characteristics of the gate structure 54 may vary from the example shown.

A number of shallow trench isolation (STI) regions 64-66 may be formed at the surface 56 in the semiconductor substrate 22. In this embodiment, the STI region 64 is disposed between the gate structure 54 and the drain region 46 to protect the gate structure 54 from the high voltage applied to the drain region 46. For example, the STI region 64 may be configured to prevent or minimize hot carrier injection (HCI) into the oxide layer of the gate structure 54. The STI region 64 is disposed in the drift region 50 to form a field drift structure. The other STI regions 65 and 66 define active areas along the periphery of the core device area 42 and the overall device area 28. The STI region 65 is disposed between the body contact region 52 and an isolation contact region 68 outside of the core device area 42.

Additional, fewer, or alternative STI regions may be disposed in the semiconductor substrate 22 to isolate or separate various contact regions, as well as other regions within the device area 28 of the device 20. For example, the body contact region 52 and the source region 44 may be separated by an additional STI region.

The conduction path of the device 20 may be configured with one or more lightly or intermediately doped transition regions 70 (e.g., n-type lightly doped drain, or NLDD, regions) at or near the source and drain regions 44 and 46. Each transition region 70 may be or include a diffused region formed in connection with the source region 44. Such transition regions may couple the source region 44 to a channel region 72 (described below). In this example, the device 20 includes an NLDD region 70 adjacent the source region 44. The NLDD region 70 may extend laterally under the gate structure 54 as shown.

When the gate structure 54 is biased, charge carriers (in this case, electrons; alternatively, holes) accumulate in one or more channel areas or regions 72. Each channel region 48 (or a portion thereof) may be formed in the body region 48 under the gate structure 54. In this example, the accumulation of electrons results in a charge inversion in the channel region 72 from the p-type of the body region 48 to an n-type conduction layer or area near the surface 56 of the semiconductor substrate 22. Once a sufficient amount of the charge carriers accumulate in the conduction layer or area, charge carriers are capable of flowing from the source region 44 toward the drain region 46 through the channel region 72.

The channel region 72 may include other regions or areas in the semiconductor substrate 22 in which charge inversion or accumulation occurs as a result of the bias applied to the gate structure 54. Charge carriers may also accumulate outside of or beyond the body region 48. For example, charge carriers may accumulate in a region of the epitaxial layer 24 between the body region 48 and the drift region 50, as well as in an accumulation region or portion of the drift region 50 near the surface 56 under the gate structure 54.

After exiting the channel region 72, the charge carriers drift through the drift region 50 to reach the drain region 36. The drift region 50 electrically couples the drain region 46 and the channel region 72. The drift region 50 may be configured to allow the charge carriers to drift under the electric field established by the drain-source voltage applied between the drain region 46 and the source region 44. In this example, the drift region 50 is an n-type well that laterally extends under the STI region 64 as a field drift region.

The drift region 50 may be configured to be depleted to reduce the magnitude of the electric field in areas in and/or around the drift region 50 via the reduced surface field (RESURF) effect to increase the voltage at which breakdown occurs along the conduction path of the device 20. In this example, the drift region 50 is depleted both laterally and vertically. A junction forms between the n-type well of the drift region 50 and the p-type epitaxial layer 24 and/or the body region 48 to establish a lateral RESURF effect. The junction is reverse-biased as a result of the application of a drain voltage Vds between the source region 44 and the drain region 46. The drift region 50 is also depleted vertically by a p-type buried well region 74 disposed under the drift region 46.

Further depletion in and around the drift region 50 may be achieved via a double RESURF arrangement in which a voltage is applied to the buried isolation layer 30 to reverse bias a junction along the buried well region 74. To that end, the device 20 includes an interconnect 76 (e.g., a patterned metal interconnect) supported by the substrate 22 to electrically tie the drain region 46 to the isolation contact region 68. A voltage may be applied during operation to the buried isolation layer 30 via the other regions of the doped isolation barrier, in this case, the stacked isolation wells 32, 34. The drain-source bias voltage may thus be used to bias the buried isolation layer 30.

However, the buried isolation layer and other components of the doped isolation barrier are biased at a voltage level lower than the drain-source bias voltage (e.g., the voltage applied to the isolation contact region 68). The full drain-source bias voltage is not directly applied to the doped isolation barrier. Instead, the potential of the doped isolation barrier is instead partially lifted to the voltage level of the drain-source bias voltage to lower the voltage stress between the body region 48 and the doped isolation barrier (e.g., the buried isolation layer 30).

Such partial biasing of the doped isolation barrier is provided by a depleted well region 78 disposed in the semiconductor substrate 22 outside of the core device area 42. The depleted well region 78 electrically couples the isolation contact region 68 and the doped isolation barrier. A portion of the drain-source bias voltage is supported by the depleted well region 78, such that only part of the bias voltage reaches the doped isolation barrier. The doped isolation barrier may thus be biased at a voltage level lower than the voltage applied to the isolation contact region 68. In this example, the depleted well region 78 is an n-type well that extends between, and is in contact with, the isolation contact region 68 and the isolation well 32. In other embodiments, the depleted well region 78 may be laterally adjacent to additional and/or alternative regions or layers of the doped isolation barrier. As described below, the depleted well region 78 may be formed in conjunction with the drift region 50, thereby using a pre-existing implant(s).

The extent of the voltage drop across the depleted well region 78 may vary in accordance with the extent to which the depleted well region 78 is depleted of charge carriers. The depleted well region 78 may be partially or fully depleted of charge carriers. The extent to which the depleted well region 78 is depleted of charge carriers may be enhanced by one or more structures or other characteristics of the periphery of the device area 28. The extent of the depletion may be enhanced both laterally and/or vertically, examples of which are described below.

In the embodiment of FIG. 1, the lateral depletion of the depleted well region 78 is enhanced through one or more gaps in the dopant implantation area for the depleted well region 78. The lateral extent of the depleted well region 78 is shown both before and after thermal diffusion (e.g., one or more post-implant dopant drives). Before thermal diffusion, the depleted well region 78 may have an interior gap 80. Thermal diffusion of the dopant of the depleted well region 78 may then fill in the gap 80, thereby lowering the dopant concentration level within an interior section or portion of the depleted well region 78. As a result, the depleted well region 78 may include an interior section that corresponds with the location of the gap 80 that has a lower dopant concentration level than a pair of exterior sections 82, 84 adjacent the isolation contact region 68 and the isolation well 32 of the doped isolation barrier, respectively. The lower dopant concentration level allows the interior section to be more easily depleted of charge carriers, despite being farther away from a reverse-biased junction. As a result, a greater amount or degree of depletion of the depleted well region 78 may thus be achieved.

The location of the gap 80 may vary. However, the interior location of the gap 80 in the example of FIG. 1 may be useful in connection with possible mask misalignment. The interior gap allows the masks for the implantation and the formation of the STI region 65 to be misaligned, and still provide the full effect of the gap 80. An alternative embodiment is shown and described in connection with FIG. 3.

Further lateral depletion is provided at the outer edge of the depleted well region 78. The depleted well region 78 does not extend across the full lateral extent of the isolation contact region 68. The depleted well region 78 laterally overlaps the isolation contact region 68 to establish the electrical coupling. However, in this example, a gap 86 is provided to allow the p-type epitaxial layer 24 to deplete the depleted well region 78 along the outer side thereof.

Depletion is accomplished in the vertical direction in the example of FIG. 1 through the presence of a p-type buried well region 88. The buried well region 88 is disposed under and in contact with the depleted well region 78. The depleted well region 78 may be thus be depleted from below in a manner similar to the way in which the drift region 50 is depleted by the buried well region 74.

Depletion in the vertical direction is also attained via a conductive flap 90 supported by the substrate 22 and positioned over the depleted well region 78. The conductive flap 90 is biased during operation to deplete the depleted well region 78. In this n-channel example, the conductive flap 90 may be grounded or otherwise biased at a low voltage level relative to the drain-source bias voltage. As a result, the charge carriers (in this case, electrons) are pushed away from the surface 56 of the substrate 22, thereby depleting the depleted well region 78 from above. The conductive flap 90 may include a polysilicon plate, one or more metal layers, or another conductive structure.

The conductive flap 90 may be spaced from the surface 56 of the substrate 22 by one or more passivation layers 92. Any one or more dielectric materials may be used for the passivation layer(s) 92.

The formation of the above-described regions involved in the partial biasing of the doped isolation barrier may not increase the complexity or cost of fabricating the device 20. For instance, and as described below in connection with the exemplary fabrication process shown in FIG. 4, the same implants (and corresponding mask layers) may be used to form the peripheral regions involved in the partial biasing. The same implant may be used to form the depleted well region 78 and the drift region 50. The depleted well region 78 may thus have a dopant concentration profile in common with the drift region 50. The same implant may be used to form the buried well region 88 and the buried well region 74. The buried well regions 74, 88 may thus have a common dopant concentration profile. Furthermore, in the example of FIG. 1, the n-type and p-type implants used to form these regions may be configured with the same mask, insofar as the layout of the n-type and p-type regions may be the same.

The partial biasing technique may also be used in connection with the edge regions disposed along the periphery of the device area 28 to protect the DTI region 29. In this example, the edge regions are the isolation wells 36, 37 and the buried layer 38. These edge regions are disposed along the inner edge of the ring-shaped DTI region 29 to act as a doped edge isolation barrier that protects against breakdown across the DTI region 29. The partial biasing of these edge regions may be used to avoid the high voltage stress that would otherwise occur if the edge regions were biased at the full drain-source bias voltage. To that end, the device 20 includes a depleted edge well region 92 disposed in the semiconductor substrate 22 outside of the core device area 42. The depleted edge well region 92 and the depleted well region 78 may be configured similarly (e.g., exactly). The depleted edge well region 92 electrically couples the isolation contact region 68 and the regions of the doped edge isolation barrier. As a result, the doped edge isolation barrier is biased at a lower voltage level than the voltage applied to the isolation contact region 68.

The partial biasing of the edge regions along the DTI region 29 may be greater, less than, or equal to the partial biasing of the doped isolation barrier. In the example of FIG. 1, the depleted well region 78 and the depleted edge well region 92 are laterally symmetrical about the isolation contact region 68. The same extent of depletion of the depleted edge well region 92 may thus be attained laterally via the same gaps (as described above) and vertically through a buried edge well region 94 and a further conductive flap 96. The edge regions of the doped edge isolation barrier may thus be biased at the same level as the regions of the other doped isolation barrier. In other cases, the partial biasing may differ if, for instance, the depleted well regions are not symmetrical (e.g., one may be wider than the other) and/or further depletion is not attained via, for instance, a conductive flap. The voltage level of the doped isolation barriers may thus be adjusted independently of one another.

The partial biasing of the doped isolation barriers may also be supported by the absence of the buried isolation layer 30 (or layer 38) under the depleted well regions 78, 92. In the example of FIG. 1, the gap 40 in the buried isolation layer 30 is positioned such that the buried isolation layer 30 does not extend under the depleted well regions 78, 92 outside of the core device area 42. In this way, the biasing of the buried isolation layer 30 occurs via the lateral path involving, for instance, the depleted well region 78 and the isolation wells 32, 34, rather than, for instance, a more direct vertical path to the isolation contact region 68.

FIG. 1 depicts the device 20 in simplified form in the sense that only one side of the device 20 is shown. The device 20 may include another side configured in a manner similar to the depicted side. For example, the other side of the device 20 may mirror or match the depicted side, such that the device 20 is symmetrical about the drain region 46. The drain region 46 may thus be disposed in the center (or along a central line) of the device 20. The other side may thus include a second source region 44 separated from the drain region 46 by a second gate structure 54. In some embodiments, the second source region 44 and the second gate structure 54 are contiguously formed with the corresponding regions of the device 20 described above via one or more connecting structures offset from the lateral cross-section shown in FIG. 1. For example, the gate structure 54 may be U-shaped or arch-shaped (e.g., a single lateral connection) or toroidal or looped (e.g., two lateral connections) when viewed from above. The shapes of the above-described regions of the device 20 may vary considerably from these examples.

Figure 2:
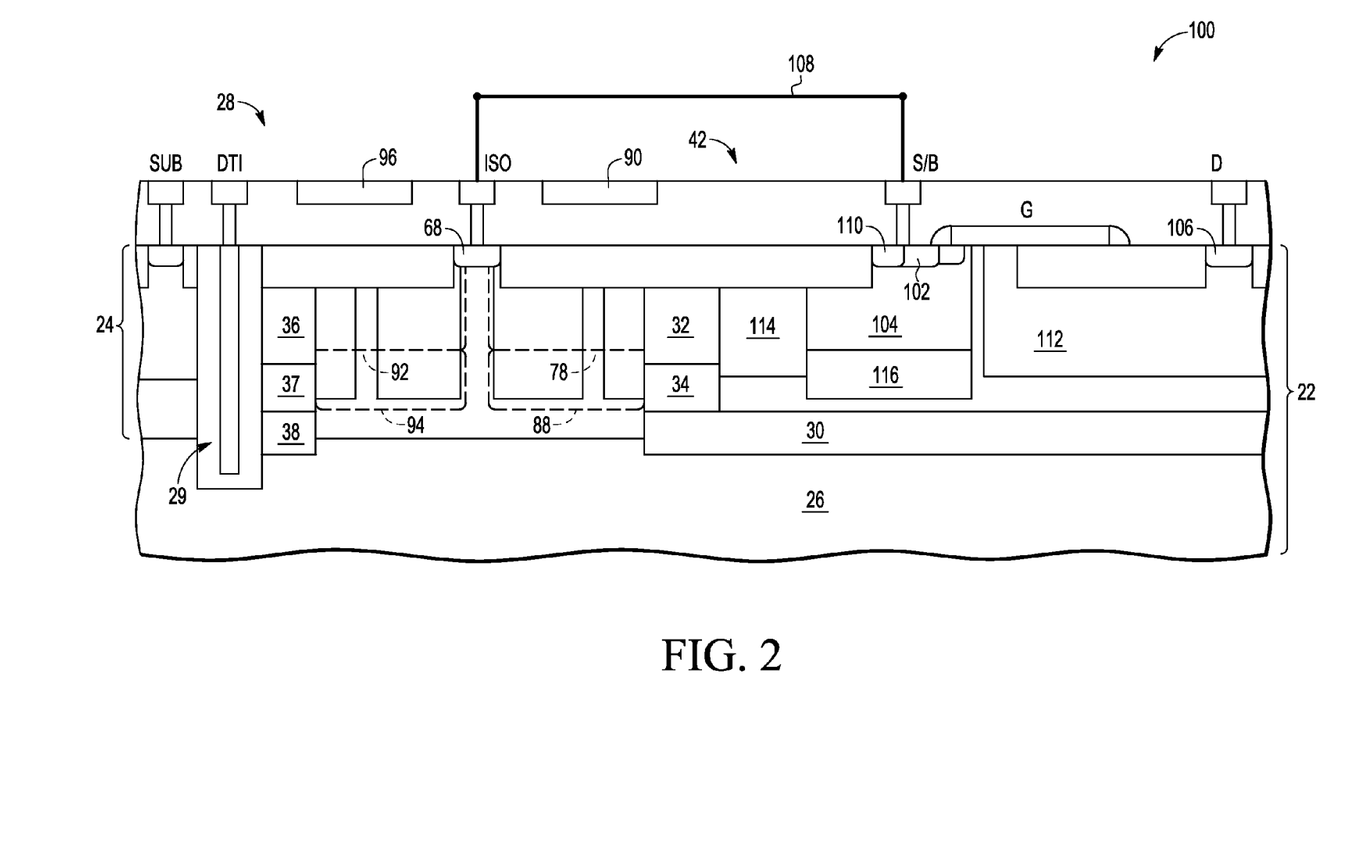
FIG. 2 is a cross-sectional, schematic, partial view of an exemplary p-channel LDMOS (or PLDMOS) transistor with partially biased isolation and a core-isolated body in accordance with one embodiment.

FIG. 2 depicts an example of a p-channel LDMOS device 100 having partially biased isolation in accordance with one embodiment. The device 100 is configured similarly in many respects to the n-channel examples described above in connection with FIG. 1. Unless noted otherwise, the structures, components, and other elements of the device 100 may be configured as described above in connection with FIG. 1. However, the differences between the devices 20, 100 may not involve merely switching the conductivity type of each region in the device 100. A number of differences instead arise from the use of a p-type substrate for the device 100. Indeed, in the example of FIG. 2, the device 100 is formed in the same p-type substrate 22 in which the device 20 is formed. The device 100 may present other differences not related to partial biasing, such as the configuration of a gate structure, and whether a field plate structure is included.

The use of the p-type substrate 22 also leads to a number of other aspects in common with the device 20 of FIG. 1. For instance, the isolation-related elements of the devices 20, 100 may be configured similarly, each of which is accordingly referenced with the same numeral used in FIG. 1. For example, the device 100 may include a DTI structure 29 that defines a device area 28, a doped isolation barrier that includes a buried isolation layer 30 and isolation wells 32, 34, and a number of edge regions along the DTI structure 29, such as edge regions 36-38. Each of the doped regions may be n-type regions as described above.

The elements of the device 100 directed to partial biasing of the doped isolation barrier of the device 100 may also be configured as described above, including the conductivity type. Thus, the device 100 includes an isolation contact region 68, and depleted well region 78, depleted edge well region 92, buried well regions 88, 94, and conductive flaps. The conductivity types, dopant concentration profiles, implantation, and other characteristics of these regions directed to partially biased isolation may be as described above. As a result, the depleted well region 78 and the depleted edge well region 92 allow the regions of the doped isolation barriers of the device 100 to be biased at a voltage level lower than the voltage applied to the isolation contact region 68, as described above.

The differences presented by the device 100 involve the elements disposed in a core device area 42. In the p-channel example of FIG. 1, the voltage applied to the isolation contact region 68 is the bias voltage applied to a source region 102 and a body region 104, rather than a drain region 106. An interconnect 108 is used to electrically tie the isolation contact region 68 to the source region 102 and, via a body contact region 110, the body region 104. The partial lifting effected by the depleted well regions 78, 92 thus allow the regions of the doped isolation barriers to not be electrically tied to the body region 104, rather than a drift region 112. In this case, the source and drain regions 102, 106 are heavily doped p-type regions, while the body contact region 110 is a heavily doped n-type region. The source region 102 is disposed in an n-type well of the body region 104. As a result, the body region 104 and the regions and layers of the doped isolation barrier have a common conductivity type, in this example. The drain region 106 is disposed in a p-type well of the drift region 112.

To allow the depleted well regions 78, 92 to partially bias the doped isolation barrier, the body region 104 is electrically isolated from the regions and layers of the doped isolation barrier within the core device area 42. To that end, the device 100 includes a number of buried well regions 114, 116 disposed in the semiconductor substrate 22 within the core device area 42. The buried well regions 114, 116 are oppositely doped (e.g., p-type) regions arranged to collectively surround the body region 104. The buried well region 114 is laterally adjacent to the body region 104, and disposed between the body region 104 and the isolation wells 32, 34, to electrically isolate the body region 104 in a lateral direction. The buried well region 116 is disposed under the body region 104 between the body region 104 and the buried isolation layer 30 to electrically isolate the body region 104 in a vertical direction. Each of the buried well regions 114, 116 may be in contact with the body region 104 as shown in FIG. 2. Alternatively, the buried well regions 114 may be adjacent to, but spaced from, the body region 104, such that the p-type doping of the epitaxial layer 24 is disposed therebetween.

In the embodiment of FIG. 2, the depleted well regions 78, 92 and the body region 104 may have a common dopant concentration profile. The n-type implant used to form the body region 104 may also be used to form the depleted well regions 78, 92. Similarly, the p-type implant used to form the buried well region 116 may also be used to form the buried well regions 88, 94. The buried well regions 88, 94, and 116 may thus have a common dopant concentration profile. In this way, and as described above in connection with FIG. 1, additional implants or masks need not be added to the fabrication process to form the regions involved in the partial biasing of the doped isolation barrier. Also as described above in connection with FIG. 1, the same mask may be used to configure both of these n-type and p-type implants. As a result, the biasing of the doped isolation barrier may be achieved in a cost-effective manner.

The formation of the buried well region 114 may also rely on a pre-existing implant procedure. In this example, the implant used to form the drift region 112 may also form the buried well region 114. The drift region 112 and the buried well region 114 may thus have a common dopant concentration profile in such n-channel LDMOS devices.

Figure 3:
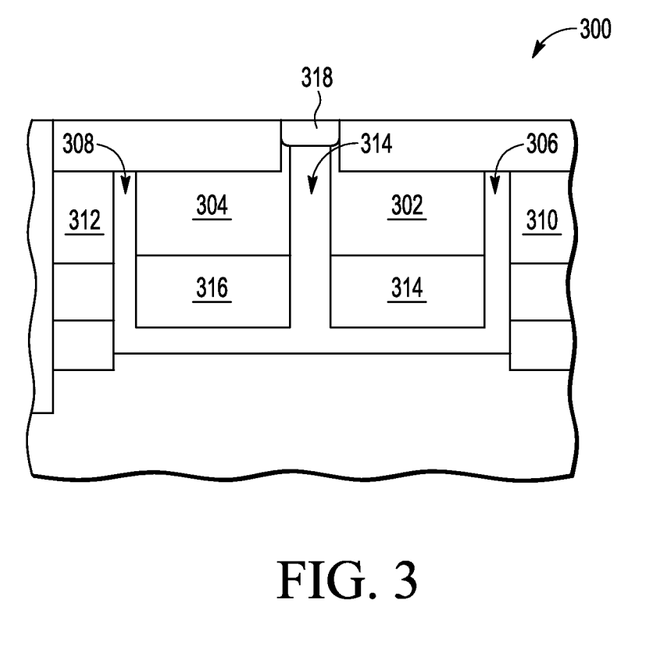
FIG. 3 is a cross-sectional, schematic, partial view of a depleted well region for partially biased isolation in accordance with one embodiment.

FIG. 3 depicts a peripheral area 300 of a device in which a number of regions are disposed and configured for partial biasing of a buried isolation barrier. For ease in illustration, the regions are shown after performance of implants but before any significant thermal diffusion. Formed in the peripheral area 300 are a depleted well region 302 and a depleted edge well region 304. The regions 302, 304 have a lateral profile that differs from the examples described above in connection with FIGS. 1 and 2. In this example, n-type dopant is implanted in areas spaced from the surrounding regions of the doped isolation barriers. Specifically, a spacing 306 exists between the depleted well region 302 and an isolation well 310, and a spacing 308 exists between the depleted edge well region 304 and an edge isolation well 312.

The location of the spacings 306, 308 may help deplete the well regions 302, 304 after thermal diffusion spreads the n-type dopant throughout the spacings 306, 308. The spacings 306, 308 are laterally farther away from the p-type dopant in a central gap 314. As a result, the portion or section of the depleted well regions 302, 304 having a lower dopant concentration level is farthest away from the p-type doped region in the central gap 314. The depletion of those sections of the well regions 302, 304 may thus be achieved more easily than if, for instance, gaps in the implant areas were positioned as described above in connection with FIGS. 1 and 2. However, in this case, any misalignment of the n-type and p-type implants used to form the regions 302, 304 and p-type regions 314, 316 relative to the position of an isolation contact region 318 (via, e.g., the formation of STI regions) may change the extent to which the dopant concentration level is lowered near the isolation wells 310, 312. For instance, misalignment resulting in a leftward shift of the n-type and p-type implants may render it more difficult to sufficiently deplete the well region 302 near the isolation well 310.

The above-described devices are shown in simplified form. For example, while FIGS. 1-3 may schematically depict an Ohmic metal layer and metal-one layer used to form various electrodes, FIGS. 1-3 do not show a number of other metal layers configured for interconnections with the electrodes. The devices may have a number of other structures or components for connectivity, isolation, passivation, and other purposes not shown in FIGS. 1-3 for ease in illustration. For instance, the devices may include a number of additional backside layers.

The dopant concentrations, thicknesses, and other characteristics of the above-described semiconductor regions in the semiconductor substrate 22 may vary. In one example of the embodiment shown in FIG. 1, the above-referenced semiconductor regions may have the following approximate concentrations and thicknesses:

| | Concentration | Thickness |
|---|---|---|
| p-epi 24: | $1 \times 10^{13}$-$5 \times 10^{15}$/cm$^3$ | 3-10 μm |
| substrate 26: | $1 \times 10^{15}$-$1 \times 10^{18}$/cm$^3$ | not applicable |
| buried layer 30: | $1 \times 10^{13}$-$1 \times 10^{16}$/cm$^3$ | 0.5-2 μm |
| wells 32, 36: | $1 \times 10^{12}$-$1 \times 10^{15}$/cm$^3$ | 1-2.5 μm |
| wells 34, 37: | $1 \times 10^{12}$-$1 \times 10^{15}$/cm$^3$ | 1-2.5 μm |
| body 48: | $1 \times 10^{16}$-$1 \times 10^{18}$/cm$^3$ | 0.5-1.5 μm |
| source 44: | $1 \times 10^{21}$-$5 \times 10^{21}$/cm$^3$ | 0.15-0.25 μm |
| drain 46: | $1 \times 10^{21}$-$5 \times 10^{21}$/cm$^3$ | 0.15-0.25 μm |
| drift 50, 78: | $5 \times 10^{15}$-$5 \times 10^{17}$/cm$^3$ | 0.5-1.5 μm |
| iso contact 68: | $1 \times 10^{21}$-$5 \times 10^{21}$/cm$^3$ | 0.15-0.25 μm |
| NLDD 70: | $1 \times 10^{17}$-$1 \times 10^{19}$/cm$^3$ | 0.2-0.3 μm |
| buried 74, 88: | $1 \times 10^{12}$-$1 \times 10^{15}$/cm$^3$ | 1-2.5 μm |

The concentrations and thicknesses may be different in other embodiments. For example, the dopant concentration of the bulk substrate 26 may vary considerably.

Figure 4:
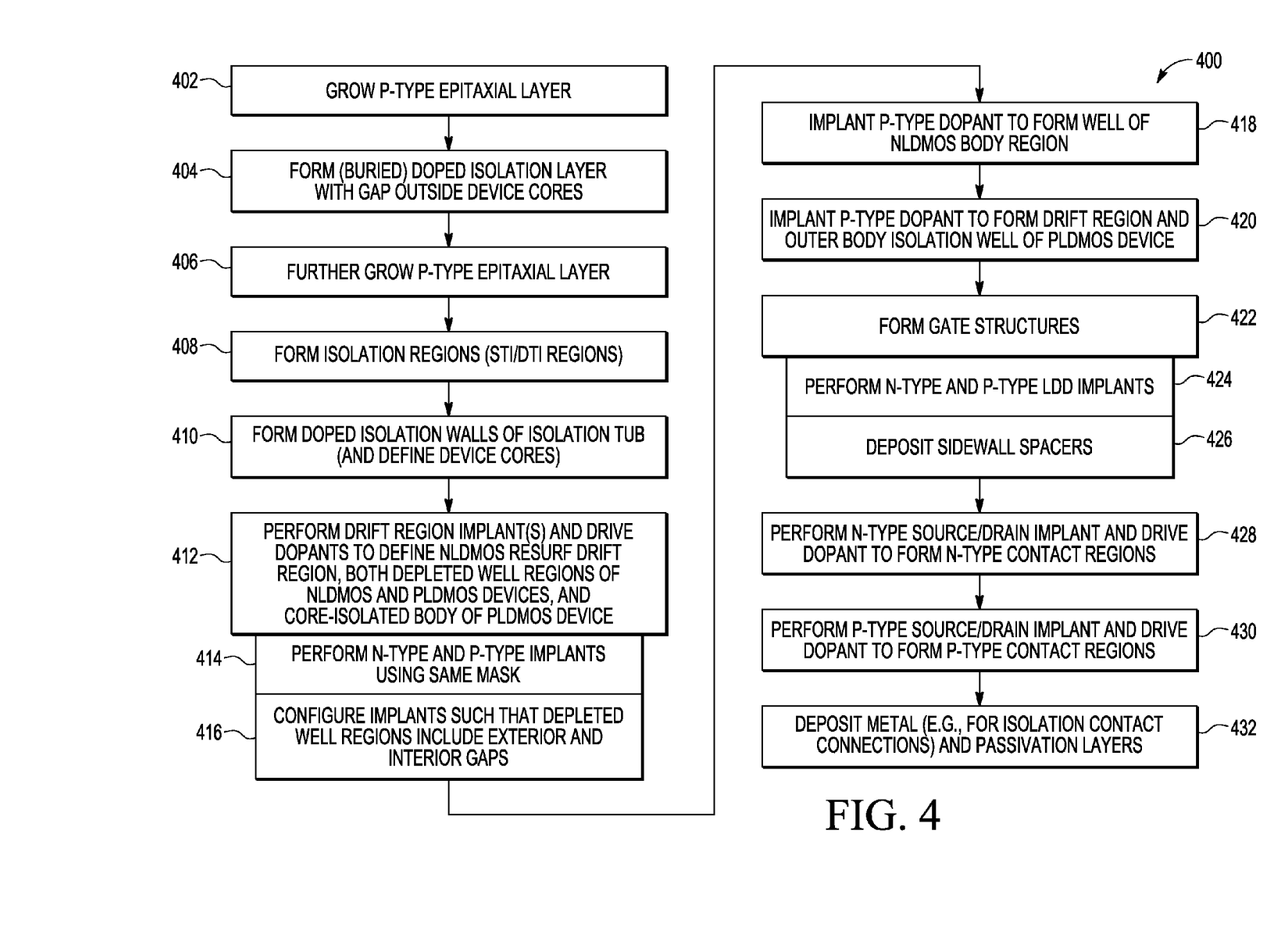
FIG. 4 is a flow diagram of an exemplary fabrication sequence to construct NLDMOS and/or PLDMOS transistors having partially biased isolation in accordance with one embodiment.

FIG. 4 shows an exemplary method 400 for fabricating one or more of the above-described devices. In this example, the method 400 is configured to fabricate both a p-channel device and an n-channel device. One or both of the devices may be LDMOS devices having a RESURF configuration and one or more of the above-described features directed to partially biasing a doped isolation barrier. The devices are fabricated with a p-type bulk semiconductor substrate, the regions or layers of which may have the conductivity types of the n-channel and p-channel examples described above, or be alternatively fabricated with an n-type substrate. The method includes a sequence of acts, only the salient of which are depicted for convenience in illustration.

The ordering of the acts may vary in other embodiments. For example, an act directed to forming isolation wells may be implemented after one or more acts configured to form well regions that are depleted to support partial biasing of a doped isolation barrier.

The method 400 may begin with one or more acts directed to the growth or other formation of one or more epitaxial layers. In this example, a p-type epitaxial layer is grown on a p-type bulk substrate in an act 402. In some cases, e.g., where the p-type bulk substrate is lightly doped, the act 402 may be optional, e.g., in the interest of reducing process costs. During or after the formation of the epitaxial layer, an isolation layer is formed in an act 404. The act 404 may include a dopant implantation or other doping technique. In other cases, the isolation layer is formed before the growth of an epitaxial layer. In either case, the method 400 then includes growth (e.g., further growth) of a p-type epitaxial layer in an act 406. As a result, the isolation layer becomes a buried isolation layer. The isolation layer may be configured with a gap outside a core device area, as described above. To that end, the act 404 may include implementation of a photolithographic or other patterning procedure.

In the example of FIG. 4, a number of STI regions and DTI structures are formed in an act 408. The STI regions may be used to define and separate active areas within and outside of the core device area. One or more STI regions may also be used to space a drain region from a gate structure in a field drift arrangement, as described above. The DTI structures may be ring-shaped to define a device area for each device. In some cases, the act 408 is implemented after implementation of one or more the implant procedures described below.

The STI regions and DTI structures may be formed via any now known or hereafter developed procedure. In some cases, the act 408 may include the formation of a trench and the deposition (e.g., chemical vapor deposition, or CVD) of one or more materials in the trench. In some embodiments, the trench is filled with silicon oxide. Additional or alternative materials may be deposited.

In an act 410, an implantation is performed to form a sidewall of a doped isolation barrier. The implantation may be configured to form one or more isolation wells, which may be vertically stacked upon one another to define the sidewall. The sidewall of the doped isolation barrier defines the lateral boundary of the core device area of the device. The isolation wells may be positioned to extend upward from the buried isolation layer such that doped isolation barrier is shaped as an isolation tub. The implantation of the act 410 may also form edge isolation wells along the DTI structure, as described above. The act 410 may be performed at various points in the fabrication procedure.

One or more dopant implantations are performed in an act 412 to form a number of well regions of the n-channel and p-channel devices. Each implantation may be configured to form multiple well regions. The multiple well regions of each implantation are configured and positioned for different purposes, despite having a common dopant concentration profile, as described above.

An n-type implantation of the act 412 is configured to form a drift region of the re-channel device and/or a body region of the p-channel device, as well as one or more depleted well regions of both the n-channel and p-channel devices. The depleted well regions are disposed outside of the core device area. The depleted well region(s) electrically couple the isolation contact region and the doped isolation barrier to support the partial biasing of the doped isolation barrier, as described above.

The p-type implantation of the act 412 may be directed to forming the buried well regions used to deplete the depleted well regions, as well as a RESURF region of the n-channel device used to deplete the drift region, and a buried well region used to isolate the body region of the p-channel device within the core device area.

In some cases, the n-type and p-type implantations of the act 412 use the same mask, as noted in act 414. The n-type and p-type implantations of the act 412 may also include configuring the implantations in an act 416 such that the depleted well regions (and the buried well regions in contact therewith) have exterior and interior gaps, as described above. The exterior gap may be under an isolation contact region, while the interior gaps are positioned to define an interior portion of the depleted well regions with a lower dopant concentration level for easier depletion. With the exterior gaps, the implantations are configured such that the depleted well regions and corresponding buried well regions do not extend across an entire lateral extent of the isolation contact region. With the interior gaps, the n-type and p-type implantations of the act 412 may be configured to provide dopant throughout a well area of the well regions except an interior portion of the well area. The act 412 may then include driving the dopant of the third implantation via thermal diffusion into the interior portion such that the well regions have a lower interior dopant concentration level for depletion of the well regions.

In the example of FIG. 4, a separate p-type implantation procedure is implemented in an act 418 to form the body region of the n-channel device. In an act 420, a p-type implantation procedure is implemented to form a drift region of the p-channel device. In some cases, the p-type implantation may also be configured to form a buried well region directed to laterally isolating the body region of the p-channel device within the core device area. The order in which these implantation procedures are implemented may vary from the order shown in FIG. 4.

Collectively, the foregoing implantation procedures may be configured such that the body region of the p-channel device is electrically isolated from the doped isolation barrier within the core device area, and such that the doped isolation barrier is biased at a different voltage level than the isolation contact region, as described above.

The fabrication process may then include one or more procedures collectively shown in act 422. The procedures may be implemented in various orders. Additional or alternative procedures may be implemented. One or more components of a gate structure may be initially be formed. For instance, a gate dielectric layer and conductive plate may be deposited and patterned. A number of implants may then be performed in an act 424 to form LDD regions. After the dopant for the LDD regions is implanted, sidewall spacers may then be deposited in an act 426. The sidewall spacers and/or other components of the gate structure may then be used for self-alignment of a source region.

In acts 428 and 430, n-type and p-type source/drain implantations are performed to form the various n-type and p-type contact regions of the devices, respectively. Source and drain regions may thus be formed for both the n-channel and p-channel devices. In examples having n-type isolation regions (e.g., a p-type substrate), the n-type source/drain implantation is also configured to form an isolation contact region outside of the core device area of the n-channel and p-channel devices. The p-type and n-type body contact regions of the n-channel and p-channel devices are also formed.

A number of metal and passivation layers may then be deposited on the substrate in an act 432. The metal layers may be patterned to form Ohmic contacts and electrodes, as well as field plates as described above, and various interconnects, including interconnects to bias the isolation contact regions as described above.

Additional, fewer, or alternative acts may be implemented. For example, any number of epitaxial layers may be grown on the original, bulk substrate. A number of acts are optional, including, for instance, acts related to elements or aspects of a gate structure or the channel, such as the formation of sidewall spacers and LDD regions.

Although described in connection with respective n-channel and p-channel LDMOS transistors, the disclosed devices are not limited to any particular transistor configuration. The partial isolation biasing of the disclosed devices may be useful in a wide variety of power electronic devices. For instance, application of the features of the disclosed devices is not limited to LDMOS or other power MOS devices. The partial isolation biasing is also not limited to any one particular type of RESURF configuration. The disclosed devices may have varying RESURF structures, including single, double, or other RESURF structural arrangements, each of which may be referred to herein as a "RESURF transistor."

For convenience of description and without any intended limitation, n-channel and p-channel LDMOS devices with a p-type substrate are described and illustrated. However, the disclosed devices are not limited to p-type substrates, such that other types of devices may be provided by, for example, substitution of semiconductor regions of opposite conductivity type. Thus, for example, each semiconductor region, layer or other structure in the example described in connection with FIGS. 1 and 2 may have a conductivity type (e.g., n-type or p-type) opposite to the type identified in the examples below.

In a first aspect, a device includes a device includes a semiconductor substrate, a doped isolation barrier disposed in the semiconductor substrate and defining a core device area within the doped isolation barrier, an isolation contact region disposed in the semiconductor substrate outside of the core device area and to which a voltage is applied during operation, and a depleted well region disposed in the semiconductor substrate outside of the core device area, the depleted well region electrically coupling the isolation contact region and the doped isolation barrier such that the doped isolation barrier is biased at a voltage level lower than the voltage applied to the isolation contact region.

In a second aspect, a device includes a semiconductor substrate, a doped isolation barrier disposed in the semiconductor substrate and defining a core device area within the doped isolation barrier, source and drain regions disposed in the semiconductor substrate within the core device area, a body region disposed in the semiconductor substrate within the core device area, and in which the source region is disposed, a drift region disposed in the semiconductor substrate within the core device area, and in which the drain region is disposed, an isolation contact region disposed in the semiconductor substrate outside of the core device area and to which a voltage is applied during operation, and a depleted well region disposed in the semiconductor substrate outside of the core device area, the depleted well region coupling the isolation contact region and the doped isolation barrier such that the doped isolation barrier is biased at a voltage level lower than the voltage applied to the isolation contact region. The depleted well region has a dopant concentration profile in common with either the body region or the drift region.

In a third aspect, a device includes a semiconductor substrate, a doped isolation barrier disposed in the semiconductor substrate and defining a core device area within the doped isolation barrier, an isolation contact region disposed in the semiconductor substrate outside of the core device area, and a body region disposed in the semiconductor substrate within the core device area, and in which a channel is formed during operation. The body region is electrically tied to the isolation contact region. The body region and the doped isolation barrier have a common conductivity type. The body region is electrically isolated from the doped isolation barrier within the core device area. The doped isolation barrier and the isolation contact region are not electrically tied to one another such that the doped isolation barrier is biased at a different voltage level than the isolation contact region.

In a fourth aspect, a method of fabricating a transistor includes performing a first implantation to form a sidewall of a doped isolation barrier, the doped isolation barrier defining a core device area within the doped isolation barrier, performing a second implantation to form an isolation contact region outside of the core device area, and performing a third implantation to form a well region outside of the core device area, the well region electrically coupling the isolation contact region and the doped isolation barrier. The third implantation provides dopant throughout a well area of the well region except a portion of the well area. Performing the third implantation includes driving the dopant of the third implantation via diffusion into the portion such that the well region has a lower interior dopant concentration level for depletion of the well region between the doped isolation barrier and the isolation contact region.

In a fifth aspect, a method of fabricating a transistor includes performing a first implantation to form a sidewall of a doped isolation barrier, the doped isolation barrier defining a core device area within the doped isolation barrier, performing a second implantation to form an isolation contact region outside of the core device area, performing a third implantation to form a body region within the core device area, and depositing a metal layer to form an interconnect that electrically ties the body region to the isolation contact region. The first, second and third implantations are configured such that the body region and the doped isolation barrier have a common conductivity type, the body region is electrically isolated from the doped isolation barrier within the core device area, and the doped isolation barrier and the isolation contact region are not electrically tied to one another such that the doped isolation barrier is biased at a different voltage level than the isolation contact region.

References to a well region or other doped region of a semiconductor having a certain conductivity type are intended to specify that the region has a net dopant concentration of the type indicated to support the indicated conductivity type. The region may have dopant of the other conductivity type therein, but the amount of such opposite dopant is insufficient to change the effective, or net, conductivity type of the region.

Semiconductor devices with a conductive gate electrode positioned over a dielectric or other insulator may be considered MOS devices, despite the lack of a metal gate electrode and an oxide gate insulator. Accordingly, the terms metal-oxide-semiconductor and the abbreviation "MOS" may be used even though such devices may not employ metals or oxides but various combinations of conductive materials, e.g., metals, alloys, silicides, doped semiconductors, etc., instead of simple metals, and insulating materials other than oxides (e.g., nitrides, oxy-nitride mixtures, etc.). Thus, as used herein, the terms MOS and LDMOS are intended to include such variations.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:
1. A device comprising:
   a semiconductor substrate;
   a doped isolation barrier disposed in the semiconductor substrate and defining a core device area within the doped isolation barrier;

an isolation contact region disposed in the semiconductor substrate outside of the core device area; and
a body region disposed in the semiconductor substrate within the core device area, and in which a channel is formed during operation;

wherein:

the body region is electrically tied to the isolation contact region;

the body region and the doped isolation barrier have a common conductivity type;

the body region is electrically isolated from the doped isolation barrier within the core device area; and the doped isolation barrier and the isolation contact region are not electrically tied to one another such that the doped isolation barrier is biased at a different voltage level than the isolation contact region.

2. The device of claim 1, further comprising a depleted well region disposed in the semiconductor substrate outside of the core device area, the depleted well region electrically coupling the isolation contact region and the doped isolation barrier.

3. The device of claim 2, wherein the depleted well region has a dopant concentration profile in common with the body region.

4. The device of claim 2, further comprising first and second buried well regions having a first conductivity type and a common dopant concentration profile, wherein:

the body region and the depleted well region have a second conductivity type;

the first buried well region is disposed under and in contact with the depleted well region; and the second buried well region is disposed under and in contact with the body region.

5. The device of claim 1, further comprising source and drain regions disposed in the semiconductor substrate within the core device area, the source and drain regions having a first conductivity type, wherein the body region, the doped isolation barrier and the isolation contact region have a second conductivity type.

6. The device of claim 1, further comprising a buried well region disposed between the body region and the doped isolation barrier, wherein the buried well region has a first conductivity type, and wherein the body region and the doped isolation barrier have a second conductivity type.

7. The device of claim 1, further comprising a well region laterally disposed between the body region and the doped isolation barrier, wherein the well region has a first conductivity type, and wherein the body region and the doped isolation barrier have a second conductivity type.

8. The device of claim 1, further comprising a plurality of buried well regions disposed in the semiconductor substrate within the core device area and arranged to collectively surround the body region.

9. The device of claim 1, wherein:

the isolation contact region and the body region are electrically tied to one another; and the doped isolation barrier is not electrically tied to the body region.

10. A device comprising:

a semiconductor substrate;

a doped isolation barrier disposed in the semiconductor substrate and defining a core device area within the doped isolation barrier;

source and drain regions disposed in the semiconductor substrate within the core device area;

a drift region disposed in the semiconductor substrate within the core device area, and in which the drain region is disposed;

an isolation contact region disposed in the semiconductor substrate outside of the core device area and to which a voltage is applied during operation; and a depleted well region disposed in the semiconductor substrate outside of the core device area, the depleted well region coupling the isolation contact region and the doped isolation barrier such that the doped isolation barrier is biased at a voltage level lower than the voltage applied to the isolation contact region, wherein the depleted well region has a dopant concentration profile in common with the drift region;

a body region disposed in the semiconductor substrate within the core device area, and in which the source region is disposed; and a further buried well region disposed in the semiconductor substrate under and in contact with the drift region, and configured to electrically isolate the body region within the core device area, wherein the buried well region and the further buried well region have a common dopant concentration profile.

11. A device comprising:

a semiconductor substrate;

a doped isolation barrier disposed in the semiconductor substrate and defining a core device area within the doped isolation barrier;

source and drain regions disposed in the semiconductor substrate within the core device area;

a drift region disposed in the semiconductor substrate within the core device area, and in which the drain region is disposed;

an isolation contact region disposed in the semiconductor substrate outside of the core device area and to which a voltage is applied during operation; and a depleted well region disposed in the semiconductor substrate outside of the core device area, the depleted well region coupling the isolation contact region and the doped isolation barrier such that the doped isolation barrier is biased at a voltage level lower than the voltage applied to the isolation contact region, wherein the depleted well region has a dopant concentration profile in common with the drift region;

a body region disposed in the semiconductor substrate within the core device area, and in which the source region is disposed, wherein:

the body region is electrically tied to the isolation contact region, the body region and the doped isolation barrier have a common conductivity type, and the body region is electrically isolated from the doped isolation barrier within the core device area.

12. The device of claim 11, further comprising a buried well region disposed between the body region and the doped isolation barrier, wherein the buried well region has an opposite conductivity type than the common conductivity type of the body region and the doped isolation barrier.

13. The device of claim 11, further comprising a well region laterally disposed between the body region and the doped isolation barrier, wherein the well region has an opposite conductivity type than the common conductivity type of the body region and the doped isolation barrier.

14. The device of claim 11, wherein:

the source and drain regions have a first conductivity type; and the doped isolation barrier, the isolation contact region, and the depleted well region have a second conductivity type.

15. A method of fabricating a transistor, the method comprising:
  performing a first implantation to form a sidewall of a doped isolation barrier, the doped isolation barrier defining a core device area within the doped isolation barrier;
  performing a second implantation to form an isolation contact region outside of the core device area;
  performing a third implantation to form a body region within the core device area; and
  depositing a metal layer to form an interconnect that electrically ties the body region to the isolation contact region;
  wherein the first, second and third implantations are configured such that:
    the body region and the doped isolation barrier have a common conductivity type;
    the body region is electrically isolated from the doped isolation barrier within the core device area; and
    the doped isolation barrier and the isolation contact region are not electrically tied to one another such that the doped isolation barrier is biased at a different voltage level than the isolation contact region.

16. The method of claim 15, wherein the third implantation is configured to form a well region outside of the core device area, the well region electrically coupling the isolation contact region and the doped isolation barrier.

17. The method of claim 16, wherein:
  the third implantation provides dopant throughout a well area of the well region except an interior portion of the well area; and
  performing the third implantation comprises driving the dopant of the third implantation via diffusion into the interior portion such that the well region has a lower interior dopant concentration level for depletion of the well region between the doped isolation barrier and the isolation contact region.

18. The method of claim 15, further comprising a fourth implantation to form a buried well region disposed under and in contact with the body region formed by the third implantation, wherein the buried well region has a first conductivity type and the body region has a second conductivity type.

19. The method of claim 18, wherein the third and fourth implantations are configured with a common implantation mask.

* * * * *